(12) United States Patent
Charpiot

(10) Patent No.: US 10,067,543 B2
(45) Date of Patent: Sep. 4, 2018

(54) CONNECTION SYSTEM FOR COMPUTER DATA BACK-UP UNIT(S)

(71) Applicant: FREEBOX, Paris (FR)

(72) Inventor: Patrick Charpiot, Chatenay Malabry (FR)

(73) Assignee: Freebox, Paris (FR)

( * ) Notice: Subject to any disclaimer, the term of this patent is extended or adjusted under 35 U.S.C. 154(b) by 0 days.

(21) Appl. No.: 15/812,891

(22) Filed: Nov. 14, 2017

(65) Prior Publication Data

US 2018/0136701 A1    May 17, 2018

(30) Foreign Application Priority Data

Nov. 15, 2016   (FR) ...................................... 16 61056

(51) Int. Cl.
| | | |
|---|---|---|
| *G06F 1/16* | (2006.01) | |
| *G06F 1/18* | (2006.01) | |
| *H05K 7/18* | (2006.01) | |
| *H05K 7/02* | (2006.01) | |
| *H05K 7/20* | (2006.01) | |

(52) U.S. Cl.
CPC ............. *G06F 1/187* (2013.01); *H05K 7/026* (2013.01); *H05K 7/18* (2013.01); *H05K 7/20127* (2013.01)

(58) Field of Classification Search
CPC ........... H05K 7/026; H05K 7/18; G06F 1/187
See application file for complete search history.

(56) References Cited

U.S. PATENT DOCUMENTS

| | | | | |
|---|---|---|---|---|
| 6,238,026 | B1 * | 5/2001 | Adams | G06F 1/184 312/223.2 |
| 7,515,410 | B1 | 4/2009 | Dingfelder et al. | |
| 8,254,106 | B2 * | 8/2012 | Lin | G11B 33/124 312/223.1 |
| 2008/0172257 | A1 | 7/2008 | Bisker et al. | |
| 2011/0069441 | A1 * | 3/2011 | Killen | G11B 33/124 361/679.33 |
| 2012/0147545 | A1 * | 6/2012 | Niu | G06F 1/187 361/679.31 |
| 2013/0161368 | A1 | 7/2013 | Lai et al. | |

OTHER PUBLICATIONS

Search Report dated Jul. 6, 2017 for corresponding application No. FR 1661056.

* cited by examiner

*Primary Examiner* — Anthony Q Edwards

(74) *Attorney, Agent, or Firm* — Knobbe, Martens, Olson & Bear, LLP

(57) ABSTRACT

The present invention relates to a connection system for connecting computer data backup units to a computer motherboard comprising:
   a support for different sizes of computer data backup units, wherein the backup units carry a connector, or carry a superposition of a plurality of connectors,
   a multi-stage connector configured to be connected to the motherboard and the backup unit connectors, wherein the multi-stage connector comprises at least two connection stages superposed and fixed to one another.
According to the invention, the at least two superposed connection stages of the multi-stage connector are offset relative to one another according to the sense of the connection to the connectors of the computer data backup units carried by the support.

10 Claims, 6 Drawing Sheets

CONNECTION SYSTEM FOR COMPUTER DATA BACK-UP UNIT(S)

The invention relates to a connection system for computer data back-up unit(s) to a computer motherboard comprising:
- a support for different sizes of computer data backup units, wherein the backup units carry a connector, or carry a superposition of several connectors.
- a multi-stage connector configured to be connected to the motherboard and to the backup unit connector(s), wherein the multi-stage connector comprises at least two connection stages that are superposed and fixed to one another.

"Computer data back-up unit" as used hereinafter is understood to mean computer hardware configured for the storage of computer data, such as a single hard disk DD, or a set of HD hard disks, or HDD hard disk drives, or a single disk or a set of disks comprising a solid state drive (SSD).

Two standard sizes of computer data back-up units are currently used, namely 2.5-inch and 3.5-inch.

Various types of male-female connection systems for data back-up units are known.

An example of a connection system for connecting two superposed 2.5-inch backup units is described in document US 2011/0069441, wherein it is based on a female connector comprising two identical female connectors fixed in superposition on the same printed circuit board (PCB) placed perpendicularly to the sense of connection to the male connectors of the superposed computer data backup units.

According to this document, when changing the size of computer data backup unit(s) or the receiving configuration, i.e. with or without superposition of computer data backup units, it is necessary to disassemble/reassemble a female connector adapted to each receiving configuration.

Such disassembly also requires the use of tools, screws, bolts or rivets to fix/unfix the female connector on/from the backup unit support.

The object of the invention is, therefore, to propose a system for connecting computer data backup units to a computer motherboard independent of the size of the data backup units, or the implementation or not of a superposition of data backup units.

To this end, the object of the invention is a connection system for connecting computer data backup units to a computer motherboard comprising:
- a support for different sizes of computer data backup units, wherein the backup units carry a connector, or carry a superposition of several connectors,
- a multi-stage connector configured to be connected to the motherboard and to the backup unit connectors, wherein the multi-stage connector comprises at least two connection stages superposed and joined to one another, wherein the at least two superposed connection stages of the multi-stage connector are offset relative to each other in the sense of connection to the data backup unit connectors carried by the support.

According to other advantageous aspects of the invention, the system for connecting computer data backup units to a computer motherboard comprises one or more of the following features taken in isolation or in all technically possible configurations:
- according to the sense of the connection, an upper connection stage of the multi-stage connector is offset with a non-zero offset towards the rear with respect to a lower connection stage;
- according to the sense of the connection, the support comprises at least one element configured to offset towards the rear an upper connector with respect to a lower connector of computer data backup units, by a non-zero offset associated with the corresponding connection stages of the multi-stage connector;
- the support comprises at least one positioning element of the backup units, wherein the backup unit positioning element is configured to maintain a permanent connection position regardless of the size of the backup units;
- an offset element is located on a positioning element;
- the at least two connection stages of the multi-stage connector are spaced apart by a spacer stage, along the height of the multi-stage connector;
- the spacer stage of the multi-stage connector comprises at least one opening intended to interact with a guide element of the support in the sense of connection;
- the multi-stage connector is made in one piece;
- the multi-stage connector further comprises at least two SATA ports associated respectively with the at least two connection stages;
- each connector comprises at least one power supply line and at least one data communication line.

These characteristics and advantages of the invention will become more clear upon reading the description which follows, given solely by way of a non-limiting example, and made with reference to the appended drawings, wherein.

Figure 1:
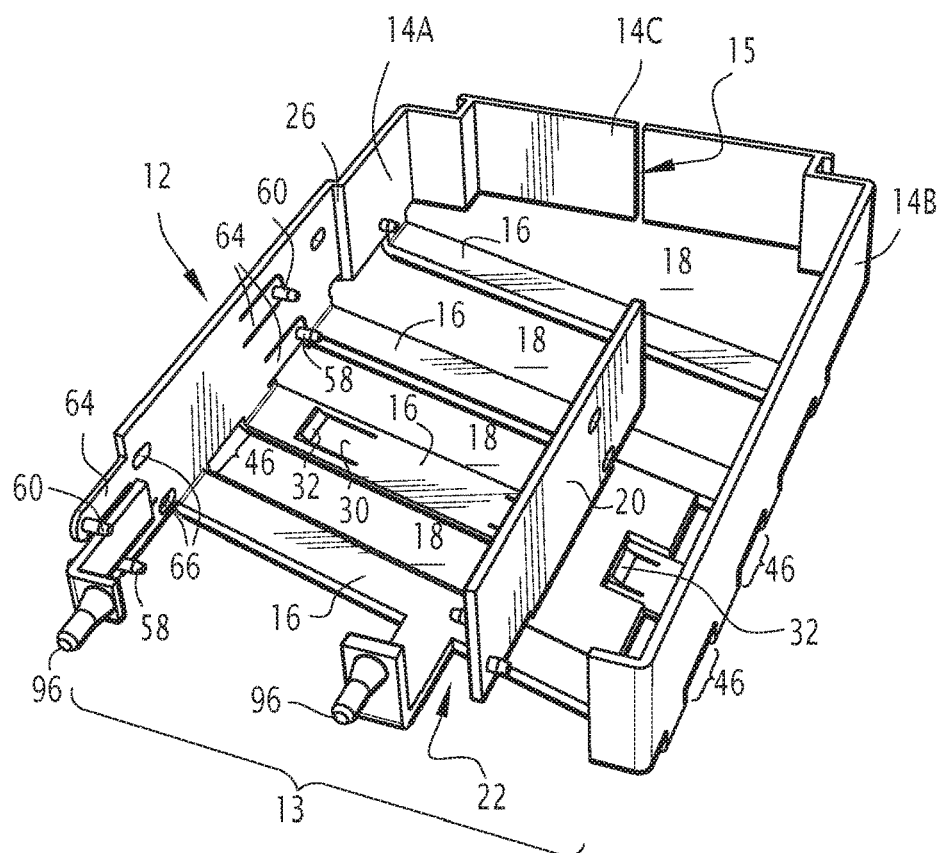
FIGS. 1 and 2 show perspective views from two distinct angles, of two receiving slots of the same support for back-up units according to the invention and associated with two distinct sizes of back-up unit.
Figure 2:
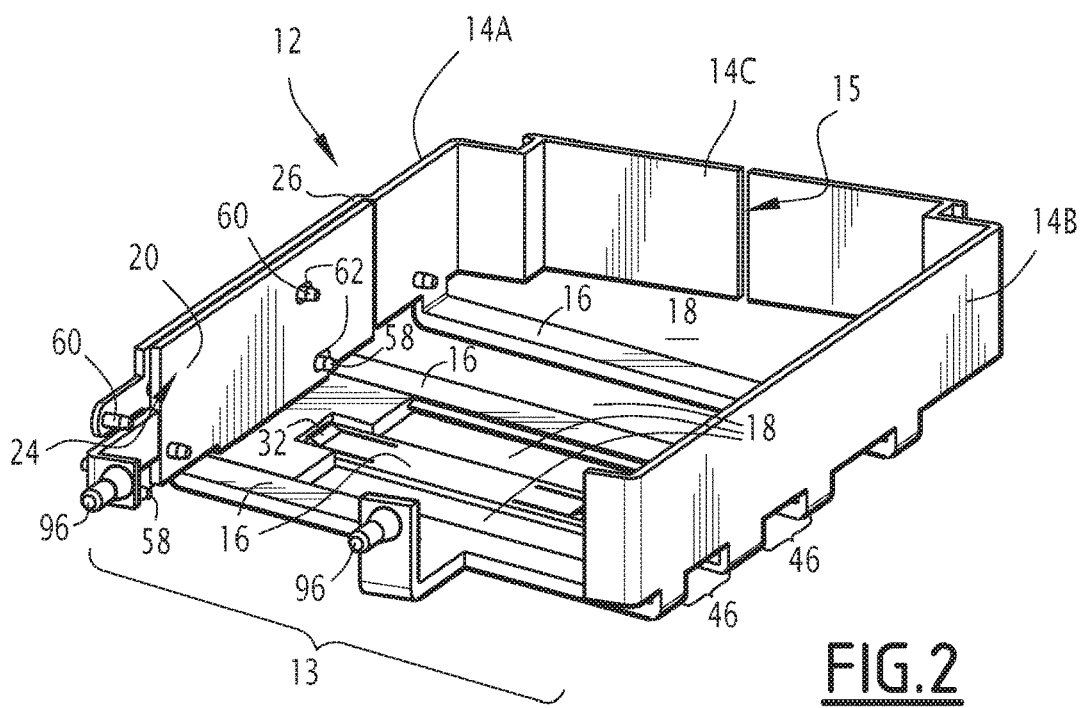
Figure 4:
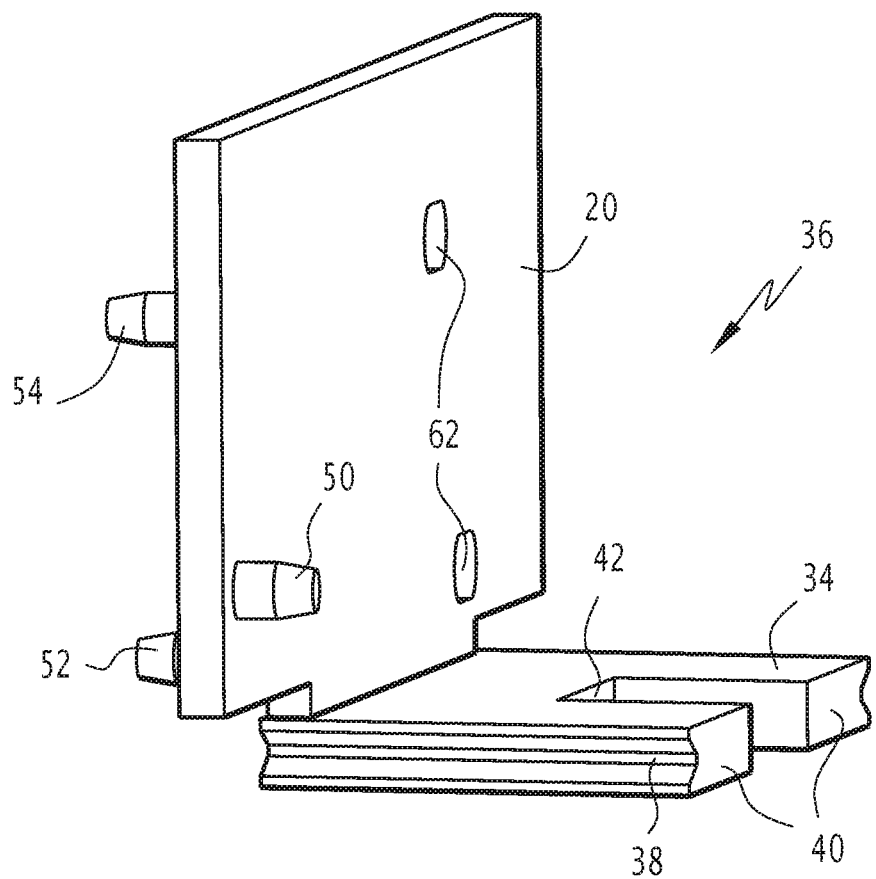
Figure 5:
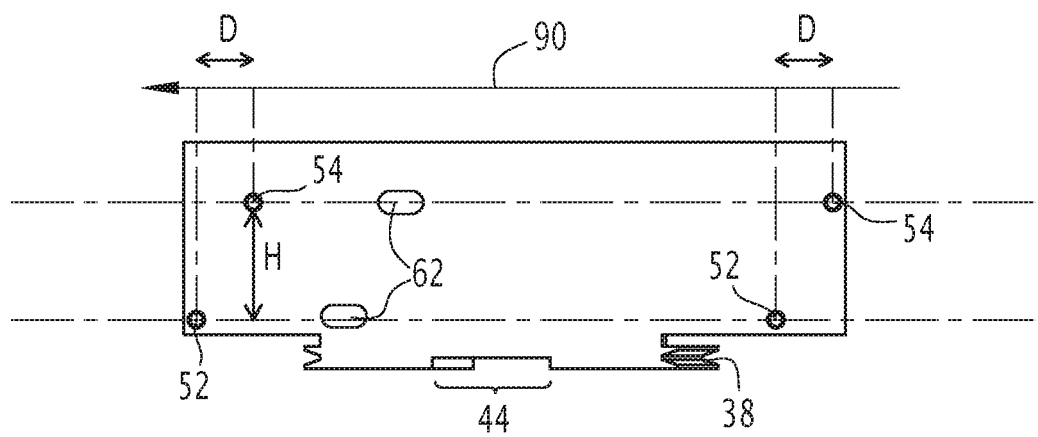
Figure 6:
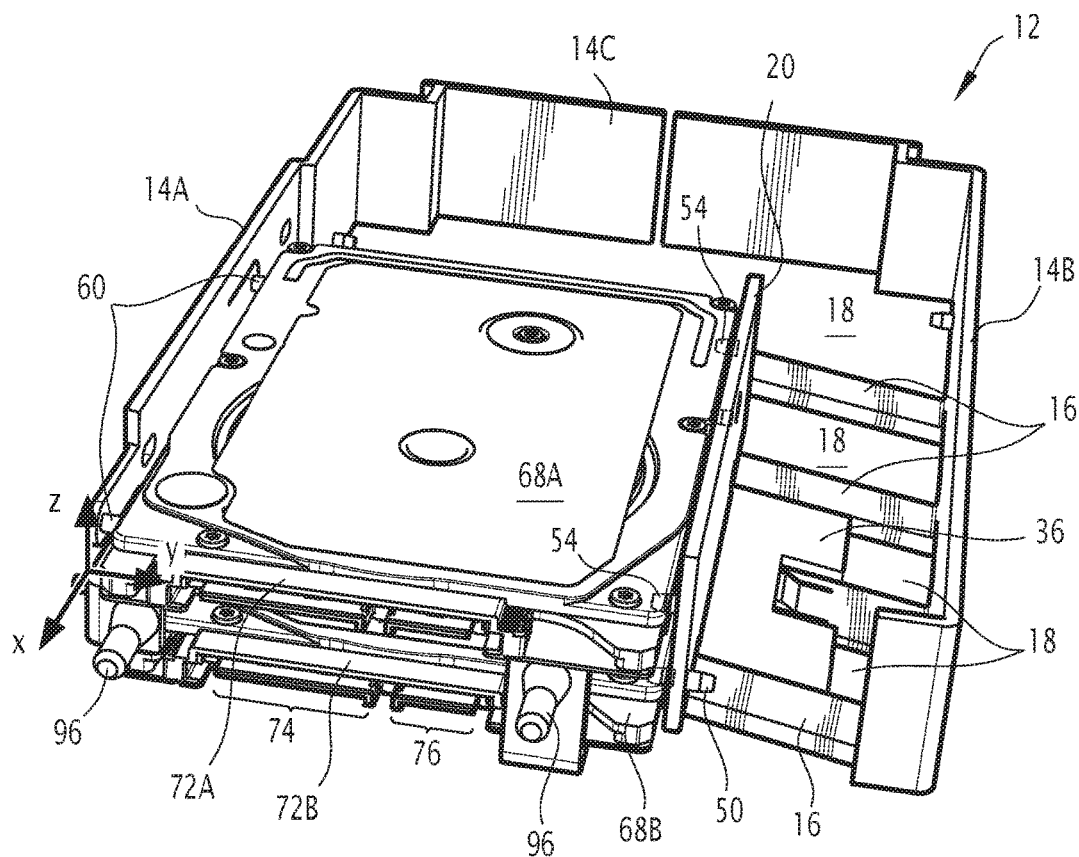
Figure 7:
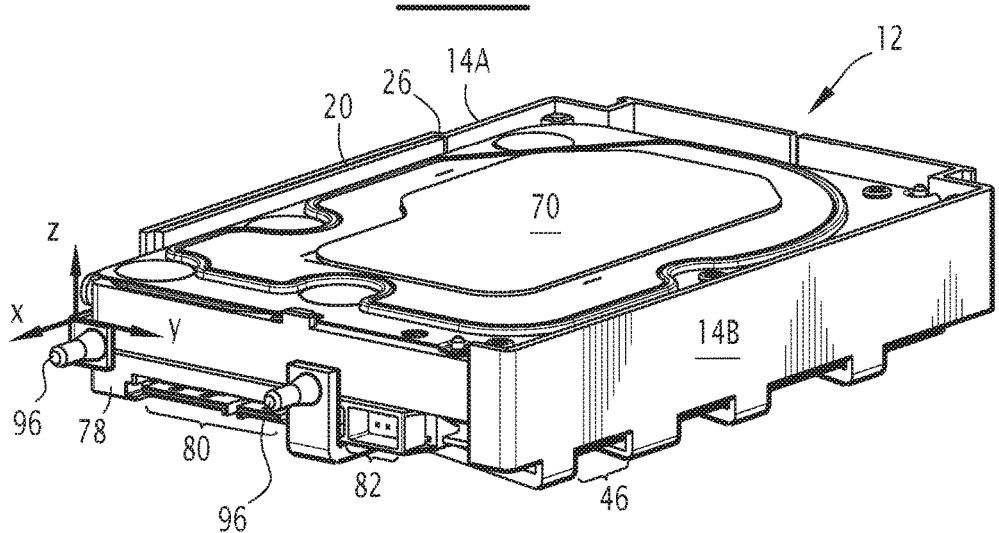

FIGS. 4 and 5 show perspective views from two distinct angles of the part carrying the movable wall, FIGS. 6 and 7 respectively show perspective views from two distinct angles, of the two receiving slots of the support illustrated in FIGS. 1 and 2 with back-up units.

Figure 8:
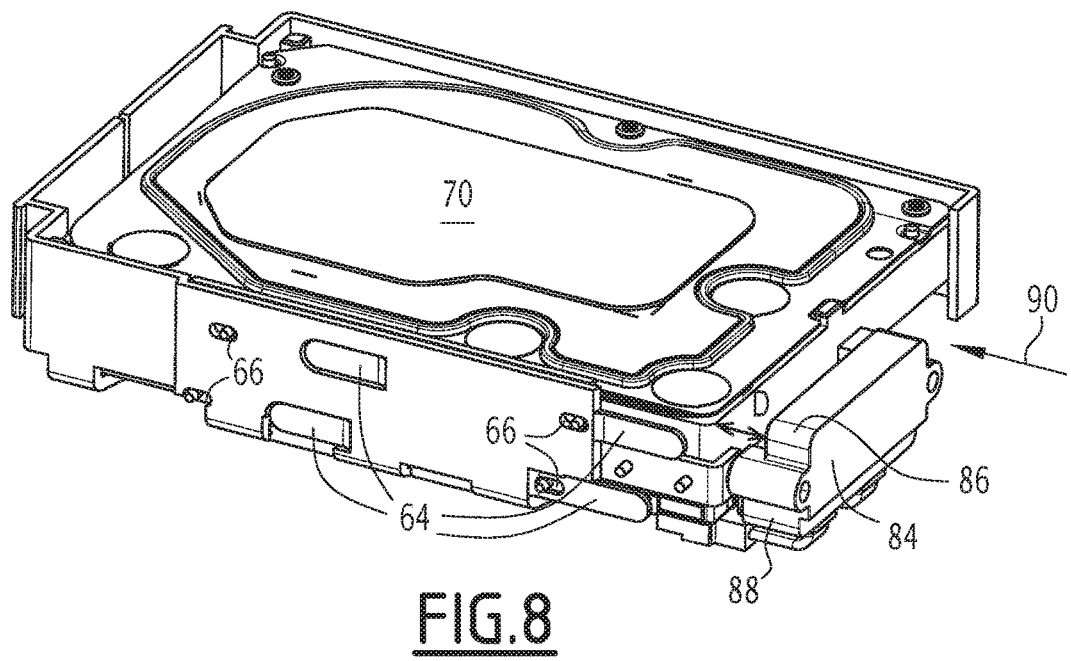
Figure 9:
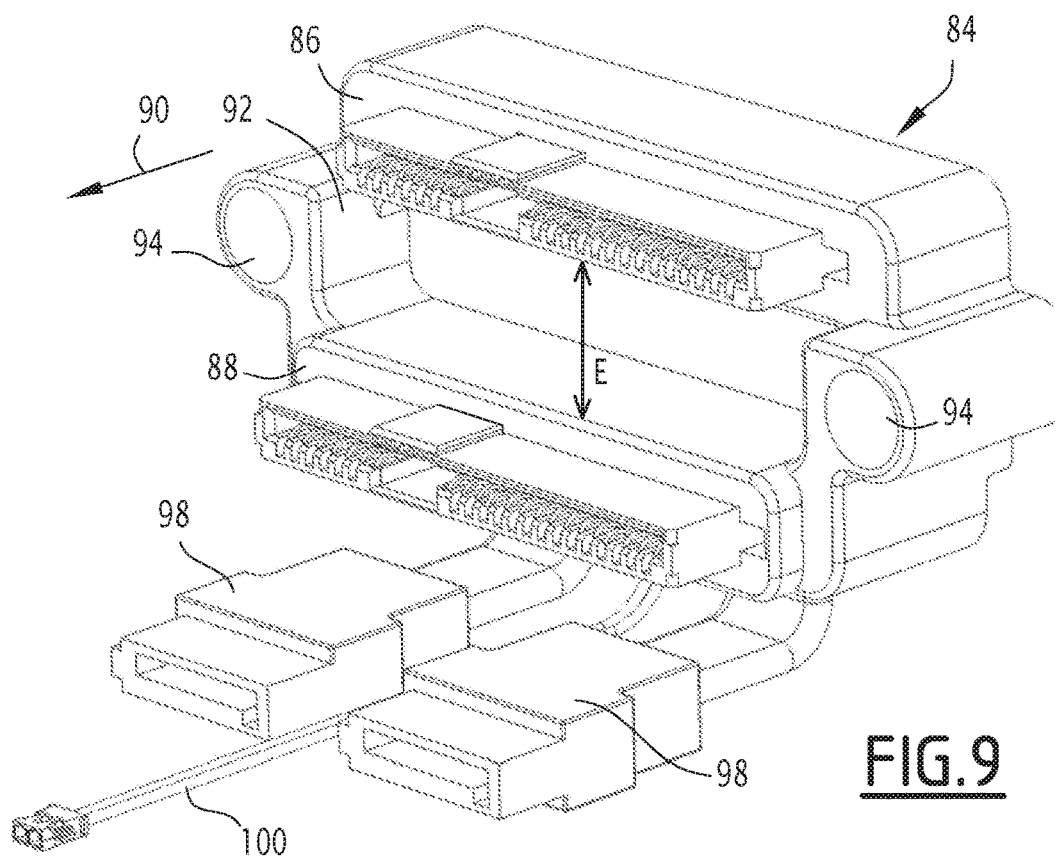
Figure 10:
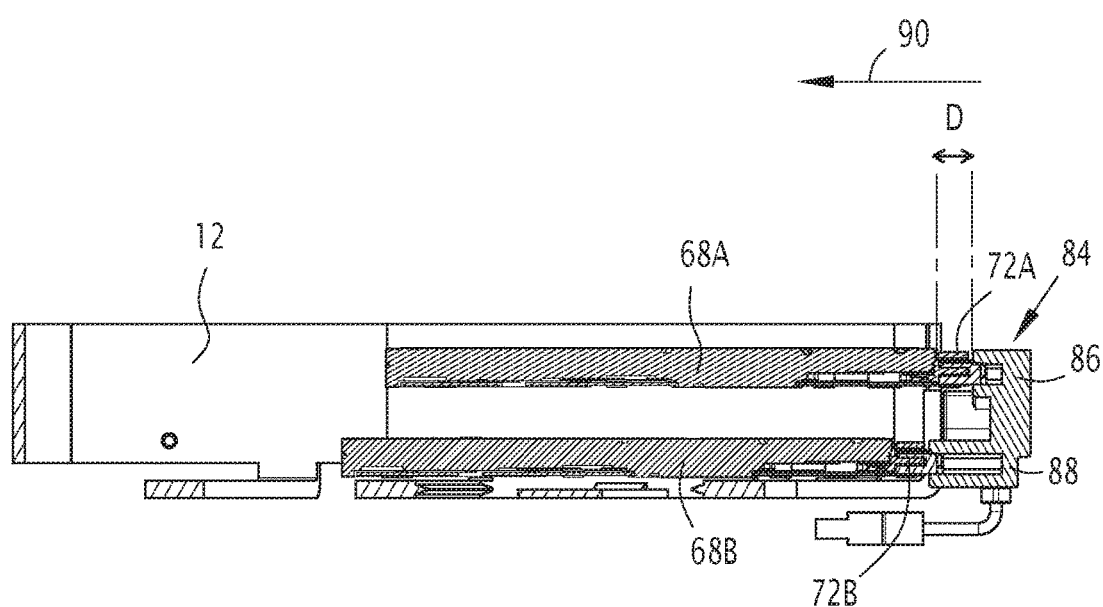

FIG. 8 shows a perspective view of the assembly of a connector to the back-up unit of the support of FIG. 7, FIG. 9 shows a perspective view of the connector of FIG. 8, FIG. 10 shows a cross-sectional view of the assembly of the connector to the backup units of the support illustrated in FIG. 6.

In FIG. 1, the support 12 of the computer data backup units is rectangular. The support 12 comprises, on one side, an opening 13 designed for the connection of backup units. On the other three sides, the support 12 is delimited by two longitudinal walls 14A and 14B and a transverse wall 14C. These three stationary walls 14A, 14B, 14C together form a frame secured perpendicularly with respect to the bottom of the support 12.

The transverse wall 14C is provided with a gap 15 to allow manual deformation of the support 12 according to the width.

The bottom of the support 12 comprises an alternating arrangement of parallel rails 16 of material constituting the support 12 and of openings 18 extending in the direction of the width of the support 12.

The support 12 also comprises an additional wall 20 extending perpendicularly relative to the bottom of the support 12. The wall 20 is parallel to the two stationary longitudinal walls 14A and 14B of the support 12.

According to the invention, the additional wall 20 is movable relative to the bottom of the support 12. In particular, the movable wall 20 may be moved in the direction of the width of the support 12 along a slide rail 16 between two extreme positions in which the wall 20 is applied against one or other of the longitudinal walls 14A and 14B.

In FIG. 1, the movable wall 20 is positioned in an extended position 22 parallel to and between the two longitudinal immobile walls 14A and 14B by sliding on the bottom of the support 12.

The extended position 22 of the movable wall 20 corresponds to a configuration for receiving a first size of a computer data backup unit, for example of 2.5 inches.

In FIG. 2, the movable wall 20 is positioned in a retracted position 24 against the internal face of one of the stationary walls 14A or 14B extending along the length of the support 12 by sliding on the bottom of the support 12.

The retracted position 24 of the movable wall 20 corresponds to a configuration for receiving a second size of a computer data back-up unit, for example of 3.5 inches, which is larger than the first size associated with the extended position 22.

The stationary wall 14A against which the movable wall 20 is positioned is shown by a broken line with an offset 26 that is designed to accommodate the thickness of the movable wall 20 in the retracted position 24 as illustrated in FIG. 2.

Such a support 12 has, for example, a length between 130 and 200 mm (or more depending on the depth of the computer or server bay into which the support is designed to be inserted), and a width of between 100 mm and 120 mm. The stationary walls 14A, 14B, 14C have, for example, a height of between 25 mm and 50 mm.

The additional movable wall 20 has a height equal to the height of the stationary walls 14A, 14B, 14C plus or minus 10%, and has a length shorter than the lengths of the longitudinal walls 14A and 14B. The length of the movable wall 20 is, for example, between 70 mm and 100 mm.

In connection with the view from below of FIG. 3, the rails 16 and the openings 18 are parallel and inclined with respect to the stationary parallel walls 14A and 14B. In particular, depending on the sliding direction 28, where the movable wall 20 is adapted to be displaced from the extended position 22 to the retracted position 24, the distance A decreases between:
- the end B of the movable wall 20 closest to the transverse wall 14C, and
- the intersection point C between the line passing through the movable wall 20 and the perpendicular line passing through the transverse wall 14C.

The rail 16 on which the movable wall 20 slides comprises latching elements 30 respectively configured to wedge the movable wall 20 at one of the extended positions 22 or retracted positions 24.

A latching element 30 of the movable wall 20 consists of a notched elastic strip formed in a slot of the rail 16 and at the end of which is placed a blocking notch 32.

Figure 3:
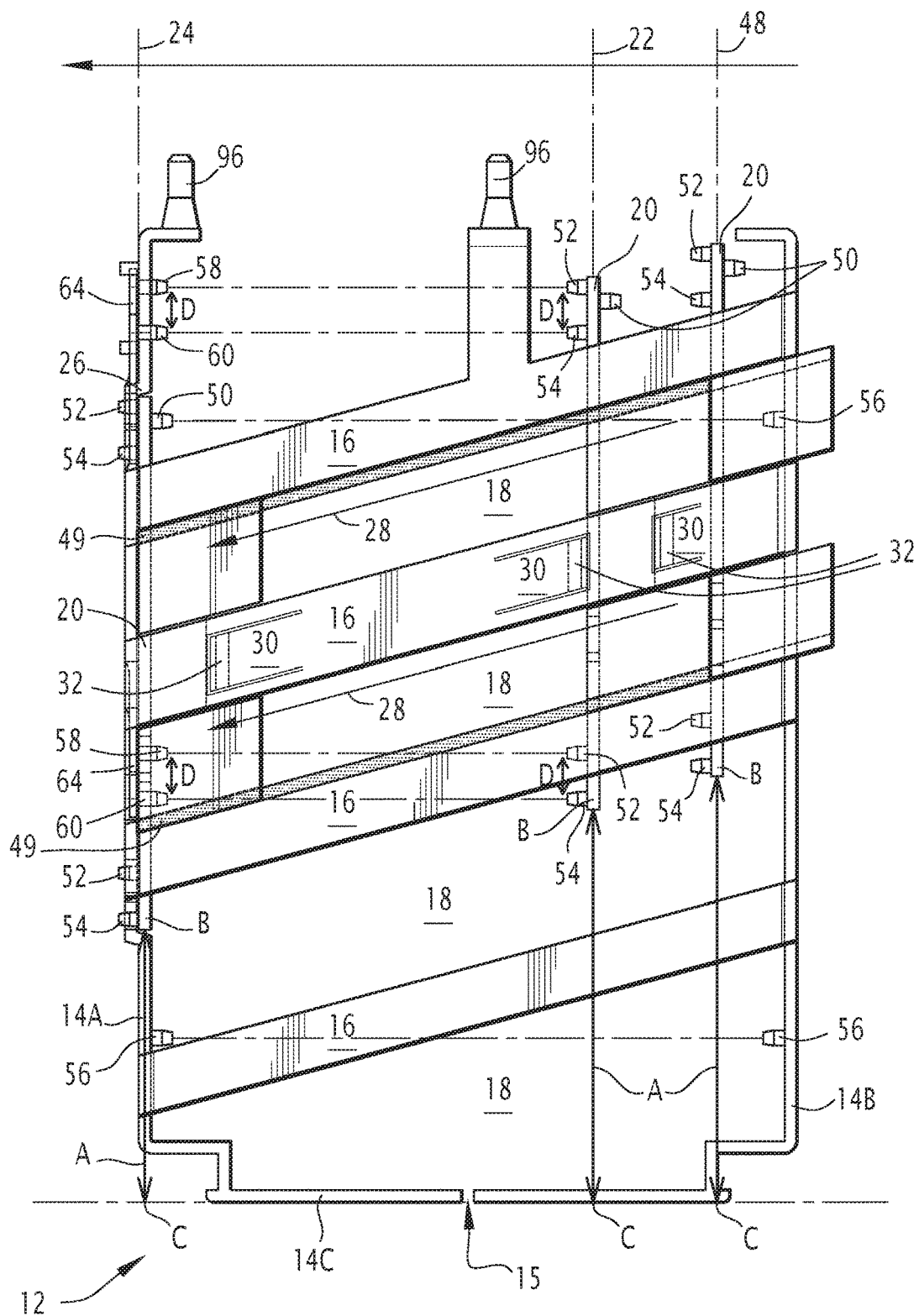
FIG. 3 shows a view from below of such a support for back-up units.

In FIG. 3, in the extended position 22, i.e. the receiving width between the stationary wall 14A of the support 12 and the movable wall 20 is 1 to 2 mm larger than the width of the data storage unit thus allowing transverse positioning freedom (i.e. mechanical play).

To promote ventilation, the material surface forming the rails 16 of the bottom of the support 12 is smaller than the surface of the openings 18.

In FIG. 4, the movable wall 20 is supported on a base 34 to form a movable assembly 36.

The U-shaped base 34 extends perpendicularly to the movable wall 20 and away from the stationary wall 14A with respect to the movable wall 20. In other words, the movable assembly 36 is L-shaped.

The base 34 has two grooves 38 open towards the outside of the free ends of the arms 40 of the U, and interacting with the facing edges of two non-adjacent rails 16.

In its central part 42, the base 34 comprises a lower notch 44 for the passage of the central rail 16 situated between the two rails 16 on which the movable assembly 36 slides.

The movable assembly 36 is detachable from the support 12. The wall 14B includes notches 46 for passing the free ends of the arms 40 of the base 36 when the movable assembly 36 is in the insertion position 48 illustrated in FIG. 3.

In the vicinity of the wall 14B, the non-adjacent rails 16 have recessed edges without a guide profile 49 thus enabling the movable assembly 36 to be positioned between the rails 16 in the insertion position 48. In other words, the length of the guide profiles 49 of the non-adjacent rails 16 is shorter than the length of the rails 16.

In FIG. 4, the movable wall 20 comprises, on the face facing the wall 14B, a blocking pin 50, depending on the height of the support 12, of a back-up unit when the movable wall 20 is in the retracted position 24.

In FIG. 5, on the other face facing the wall 14B, the movable wall 20 comprises a row of two lower pins 52 and a row of two upper pins 54 for blocking, depending on the height of the support 12, of back-up units that overlap when the movable wall 20 is in the extended position 22.

These lower pins 52 and these upper pins 54 make it possible to avoid the traditional use of screws in order to hold a back-up unit on a conventional support.

In FIG. 3, the acute angle formed between the direction of the rails 16 and the inclined openings 18 of the support 12 and the perpendicular to the two parallel stationary walls 14A and 14B, is designed to align perpendicularly to the two parallel longitudinal walls 14A and 14B, with:
- the two lines of lower and upper pins 52 of the movable wall respectively with the two lines of lower pins 58 and upper pins 60 of the wall 14A when the mobile wall 20 is in the extended position 22, and
- the pin 50 of the movable wall 20 with a corresponding pin 56 of the wall 14B when the movable wall 20 is in the retracted position 24.

The pins 50, 52, 54, 56, 58, 60 are capable of supporting the lower face of a back-up unit through such as cleats, or through the insertion of such as dowels transversely into dedicated holes (i.e. tapped holes) positioned on the lateral faces and longitudinal faces of the computer data storage units.

The movable wall 20 also comprises bores 62 for the passage of the pins 58 and 60 of the wall 14A when the mobile wall 20 is in the retracted position 24. Conversely, the stationary wall 14A comprises bores 66 for the passage of the pins 54 and 52 of the movable wall 20 in the retracted position 24.

At least one of the pins 58, 60 of the wall 14A is retractable or supported on a deformable strip 64 integrated in the wall 14A.

The support 12 is made of a material, for example plastic, that is designed to deform by inserting/removing the computer data back-up units.

In FIG. 6, two 2.5-inch data back-up units 68A and 68B are inserted to overlap in the support 12, where the movable wall 20 is in the extended position 22.

The two 2.5-inch data back-up units 68A and 68B respectively comprise two male connectors 72A and 72B in the opening 13 of the support 12 illustrated in FIGS. 1 and 2. Each male connector 72A or 72B comprises at least one row 74 of power supply pins and at least one row 76 of data communication pins.

In FIG. 7, a 3.5 inch data back-up unit is inserted into the support 12 where the movable wall 20 is in the retracted position 24.

The 3.5-inch data back-up unit 70 comprises a male connector 78 in the opening 13 of the holder 12. The male connector 78 also comprises at least one row 80 of electrical power supply pins and at least one row 82 of data communication pins.

It may be seen that, in the reference (x, y, z) centered on the free end of the wall 14B, the position of the lower male connector 72B in the extended position 22 of the movable wall 20 and the position of the male connector 78 in the retracted position 24 of the movable wall 20 are identical.

In other words, the movable wall 20 is a positioning element for computer data back-up units enabling, depending on its extended position 22 or retracted position 24, the maintenance of a permanent connection position independent of the computer data back-up unit sizes.

Furthermore, there is an interdependence between the length of the pins 58 and 60 of the wall 14B, the length of the pin 50 of the movable wall 20, and the thickness of the movable wall 20.

In FIG. 8, a female connector 84 is assembled on the male connector 78 of the computer data back-up unit 70 of the support 12 of FIG. 7. The female connector 84 is multi-level and comprises two overlapping connection levels 86 and 88 that are joined to one another, as shown in FIG. 9. Such a multi-level connector 84 is, for example, secured to the bottom of a computer or server bay.

In FIG. 9, the upper connection level 86 of the multi-level connector 84 is offset with respect to the lower connection level 88, with a non-zero offset D towards the rear with respect to the connection direction 90 of the multi-level connector 84 to the connector(s) 78 or 72A and 72B of the computer data back-up units supported by the support 12.

Conversely, in FIG. 10, the upper male connector 72A is offset relative to the lower male connector 72B towards the rear with respect to the connection direction 90 according to the same non-zero offset D.

The offset elements of the support 12 allowing such a non-zero offset D in the direction 90 connecting the male connectors 72A and 72B of overlapping back-up units 68A and 68B are, on the one hand, the two rows of lower pins 52 and upper pins 54 supported by the movable wall 20 shown in FIGS. 3 and 5, and, on the other hand, the two rows of lower pins 58 and upper pins 60 supported on the wall 14B shown in FIG. 3.

In other words, the offset position of the lower pins 52, 58 and upper pins 54, 60 of the support 12 is complementary, according to the direction 90 of connection, to that of the lower connection levels 88 and upper levels 86 of the multi-level connector 84.

The multi-level connector 84 is formed in one piece, for example by overmolding.

Furthermore, the at least two connection levels 86 and 88 are spaced apart by a spacing level 92, depending on the height of the multi-level connector 84.

In order to promote ventilation and to allow the reception of different thicknesses of computer data back-up unit, the two rows of lower and upper pins 52 and 54 of the movable wall 20 and the corresponding two rows of lower pins 58 and upper pins 60 of the wall 14B are spaced apart at a distance H that is larger than a maximum thickness of the computer data back-up units.

Conversely, the height E of the spacing level 92 of the multi-level connector 84 depends on the distance H between the rows of pins of the support 12.

Furthermore, the spacing level 92 of the multi-level connector 84 comprises at least one opening 94 intended to interact with a connecting guide element 96 of the support 12 in the direction 90 of connection.

The multi-level connector 84 further comprises at least two SATA (Serial Advanced Technology Attachment) ports (98) respectively associated with the at least two connection levels 86 and 88 and connected to the computer or server motherboard (not shown). The multi-level connector 84 also includes a power supply port 100.

It may be seen that with such a support 12 for computer data back-up units, the changeover in size of the back-up units is manual, simple and fast.

Furthermore, this change does not require any additional tools or parts, while no part of the support 12 or of the multi-level connector 84 hinders the proper installation of a computer data storage unit in the receiving slot selected by the user.

The invention claimed is:

1. Connection system for connecting computer data backup units to a computer motherboard comprising:
   a support for different sizes of computer data backup units, wherein the backup units carry a connector or carry a superposition of a plurality of connectors,
   a multi-stage connector configured to be connected to the motherboard and the backup unit connectors, wherein the multi-stage connector comprises at least two connection stages superposed and fixed to one another,
   wherein
   the at least two superposed connection stages of the multi-stage connector are offset relative to each other according to the sense of the connection(s) to the connector(s) of the backup unit(s) carried by the support.

2. Connection system for connecting computer data backup units according to claim 1, wherein, according to the sense of the connection, an upper connection stage of the connector is offset by a non-zero offset towards the rear relative to a lower connection stage.

3. Connection system for connecting computer data backup units according to claim 2, wherein the support comprises at least one offset element configured to offset towards the rear an upper connector relative to a lower connector of the computer data backup units by the associated non-zero offset with respect to the corresponding connection stages of the multi-stage connector.

4. Connection system for connecting computer data backup units according to claim 1, wherein the support comprises at least one positioning element of the back-up units in the support, wherein the backup unit positioning element is configured to maintain a permanent connection position irrespective of the size of the backup units.

5. Connection system for connecting computer data backup units according to claim 3, wherein an offset element is located on a positioning element.

6. Connection system for connecting computer data backup units according to claim 1, wherein the at least two stages of connection of the multi-stage connector are spaced apart by a spacing stage, along the height of the multi-stage connector.

7. Connection system for connecting computer data backup units according to claim 6, wherein the spacing stage of the multi-stage connector comprises at least one opening to interact with a guide element of the support according to the sense of the connection.

8. Connection system for connecting computer data backup units according to claim 1, wherein the multi-stage connector is formed in one piece.

9. Connection system for connecting computer data backup units according to claim 1, wherein the multi-stage connector further comprises at least two SATA ports associated respectively with the at least two stages of connection.

10. Connection system for connecting computer data backup units according to claim 1, wherein each connector comprises at least one power supply line and at least one data communication line.

\* \* \* \* \*